(12) United States Patent
Marumoto

(10) Patent No.: US 11,862,483 B2
(45) Date of Patent: Jan. 2, 2024

(54) SUBSTRATE PROCESSING METHOD AND SUBSTRATE PROCESSING APPARATUS

(71) Applicant: Tokyo Electron Limited, Tokyo (JP)

(72) Inventor: Hiroshi Marumoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 58 days.

(21) Appl. No.: 17/467,645

(22) Filed: Sep. 7, 2021

(65) Prior Publication Data

US 2022/0076968 A1 Mar. 10, 2022

(30) Foreign Application Priority Data

Sep. 9, 2020 (JP) ................................ 2020-151297

(51) Int. Cl.
*H01L 21/67* (2006.01)
*H01L 21/673* (2006.01)
(Continued)

(52) U.S. Cl.
CPC .. *H01L 21/67023* (2013.01); *H01L 21/02019* (2013.01); *H01L 21/30604* (2013.01);
(Continued)

(58) Field of Classification Search
CPC ......... H01L 21/67023; H01L 21/02019; H01L 21/30604; H01L 21/67051; H01L 21/67248; H01L 21/6732; H01L 21/68764; H01L 22/26; H01L 21/02057; H01L 22/12; H01L 21/67017; H01L 21/67288; H01L 21/67253; H01L 21/67034; H01L 21/6708;
(Continued)

(56) References Cited

U.S. PATENT DOCUMENTS 9,190,337 B2 * 11/2015 Sakai ................ H01L 21/30604
2005/0026455 A1 * 2/2005 Hamada .............. H01L 21/3212
257/E21.309
(Continued)

FOREIGN PATENT DOCUMENTS

JP 2017-092387 A 5/2017
JP 2018195738 A * 12/2018 ....... H01L 21/67017
(Continued)

*Primary Examiner* — Duy Vu N Deo
(74) *Attorney, Agent, or Firm* — Pearne & Gordon LLP

(57) ABSTRACT

A substrate processing method includes performing a liquid processing, detecting a temperature, generating temperature distribution information and determining whether a result of the liquid processing is good or bad. The liquid processing is performed on a substrate by using a processing unit. A temperature of a central portion of the substrate and a temperature of an edge portion of the substrate in the liquid processing are detected by using multiple sensors provided in the processing unit. The temperature distribution information indicating an in-surface temperature distribution of the substrate in the liquid processing is generated based on one or more parameter values defining a processing condition for the liquid processing and the temperature of the central portion of the substrate and the temperature of the edge portion of the substrate. Whether the result of the liquid processing is good or bad is determined based on the temperature distribution information.

17 Claims, 14 Drawing Sheets

(51) Int. Cl.
　　　*H01L 21/687*　　(2006.01)
　　　*H01L 21/306*　　(2006.01)
　　　*H01L 21/02*　　(2006.01)
　　　*H01L 21/66*　　(2006.01)

(52) U.S. Cl.
　　　CPC .... *H01L 21/6732* (2013.01); *H01L 21/67051* (2013.01); *H01L 21/67248* (2013.01); *H01L 21/68764* (2013.01); *H01L 22/26* (2013.01); *H01L 21/02057* (2013.01); *H01L 22/12* (2013.01)

(58) Field of Classification Search
　　　CPC .. H01L 21/68728; B05C 5/00; B05C 11/1015
　　　USPC ..................................... 438/745–754; 216/84
　　　See application file for complete search history.

(56) References Cited

U.S. PATENT DOCUMENTS

2018/0156665 A1* 6/2018 Jung .................... H01L 21/6715
2020/0110390 A1* 4/2020 Banna .............. G05B 19/41875

FOREIGN PATENT DOCUMENTS

KR　　　20180094492 A　*　8/2018　....... H01L 21/67075
WO　　　WO-0111680 A1　*　2/2001　......... G01R 31/2831

* cited by examiner

FIG. 7

| WAFER ID | LOT ID | UNIT ID | PROCESSING CONTENT | CENTER TEMPERATURE | EDGE TEMPERATURE | SPACE TEMPERATURE | SPACE HUMIDITY | DISCHARGE FLOW RATE | ROTATION NUMBER | ... |
|---|---|---|---|---|---|---|---|---|---|---|
| W1 | L1 | U1 | S101 | ... | ... | ... | ... | ... | ... | ... |
|  |  |  | S102 | ... | ... | ... | ... | ... | ... | ... |
|  |  |  | S103 | ... | ... | ... | ... | ... | ... | ... |
|  |  |  | S104 | ... | ... | ... | ... | ... | ... | ... |
| W2 | L1 | U2 | ... | ... | ... | ... | ... | ... | ... | ... |
| ... | ... | ... | ... |  |  |  |  |  |  |  |
| W26 | L2 | U1 | ... | ... | ... | ... | ... | ... | ... | ... |
| ... | ... | ... | ... |  |  |  |  |  |  |  |

FIG. 10

| WAFER ID | W1 | W2 | W3 | W4 | ... |
|---|---|---|---|---|---|
| ETCHING AVERAGE VALUE | 20 | 20 | 20 | 18 | ... |
| ETCHING UNIFORMITY | 10 | 10 | 10 | 13 | ... |

FIG. 11

| UNIT ID | U1 | U2 | U3 | U4 | ... |
|---|---|---|---|---|---|
| ETCHING AVERAGE VALUE | 20 | 20 | 20 | 18 | ... |
| ETCHING UNIFORMITY | 10 | 10 | 10 | 13 | ... |

| LOT ID | L1 | L2 | L3 | L4 | ⋯ |
|---|---|---|---|---|---|
| ETCHING AVERAGE VALUE | 20 | 20 | 20 | 18 | ⋯ |
| ETCHING UNIFORMITY | 10 | 10 | 10 | 13 | ⋯ |

SUBSTRATE PROCESSING METHOD AND SUBSTRATE PROCESSING APPARATUS

CROSS-REFERENCE TO RELATED APPLICATION

This application claims the benefit of Japanese Patent Application No. 2020-151297 filed on Sep. 9, 2020, the entire disclosure of which is incorporated herein by reference.

TECHNICAL FIELD

The various aspects and embodiments described herein pertain generally to a substrate processing method and a substrate processing apparatus.

BACKGROUND

Conventionally, there is known a substrate processing apparatus configured to process a substrate such as a semiconductor wafer by supplying a processing liquid onto the substrate while rotating the substrate.

Patent Document 1: Japanese Patent Laid-open Publication No. 2017-092387

SUMMARY

In one exemplary embodiment, a substrate processing method includes performing a liquid processing, detecting a temperature, generating temperature distribution information and determining whether a result of the liquid processing is good or bad. In the performing of the liquid processing, the liquid processing is performed on a substrate by using a processing unit including a substrate holding mechanism configured to hold the substrate horizontally and a processing liquid supply configured to discharge a processing liquid toward the substrate held by the substrate holding mechanism. In the detecting of the temperature, a temperature of a central portion of the substrate and a temperature of an edge portion of the substrate in the liquid processing are detected by using multiple sensors provided in the processing unit. In the generating of the temperature distribution information, the temperature distribution information indicating an in-surface temperature distribution of the substrate in the liquid processing is generated based on one or more parameter values defining a processing condition for the liquid processing and the temperature of the central portion of the substrate and the temperature of the edge portion of the substrate detected in the detecting of the temperature. In the determining of whether the result of the liquid processing is good or bad, whether the result of the liquid processing is good or bad is determined based on the temperature distribution information.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7 is a diagram illustrating an example of collection information according to the exemplary embodiment;

FIG. 10 is a diagram illustrating an example of determining presence or absence of a difference between wafers;

FIG. 11 is a diagram illustrating an example of determining presence or absence of a difference between processing units;

DETAILED DESCRIPTION

Figure 1:
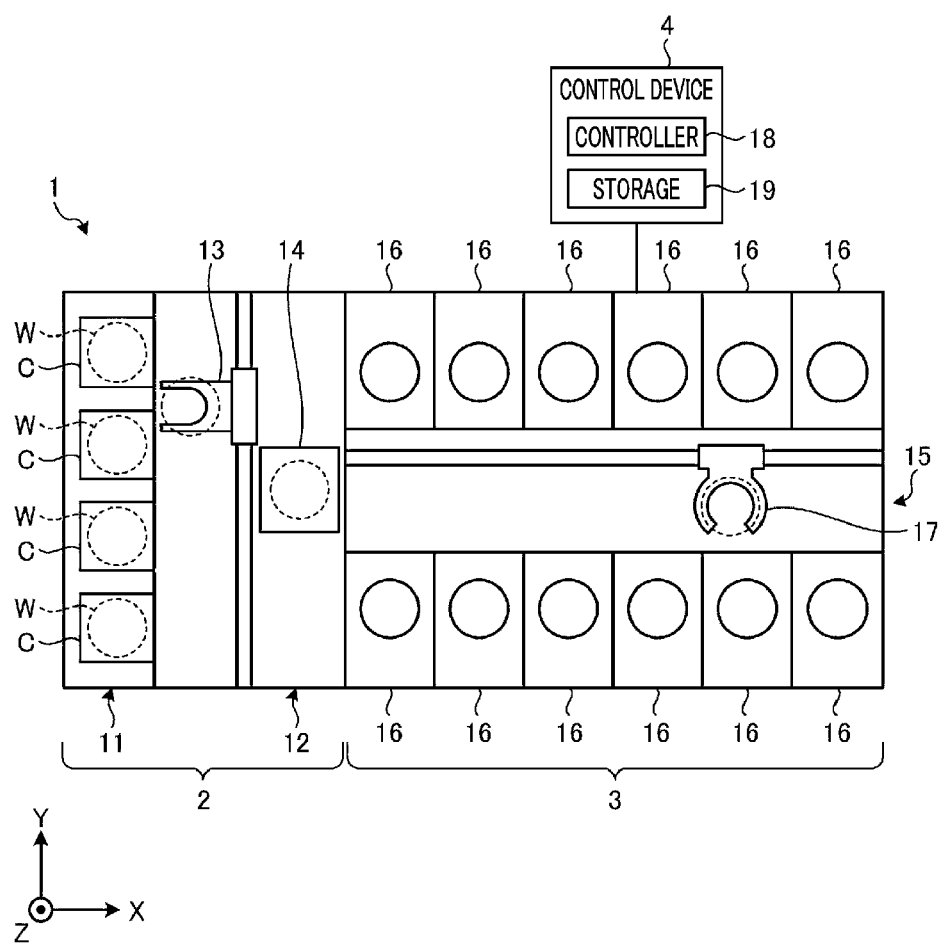
FIG. 1 is a diagram illustrating a schematic configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing method and a substrate processing apparatus according to the present disclosure will be described in detail with reference to the accompanying drawings. However, it should be noted that the substrate processing method and the substrate processing apparatus of the present disclosure are not limited by the following exemplary embodiments.

In a liquid processing in which a substrate (hereinafter, referred to as "wafer") such as a semiconductor wafer is processed by supplying a processing liquid onto the wafer, a wafer temperature in the liquid processing is one of critical factors that affect a processing result. Thus, to investigate more accurately whether the processing result is good or bad, it is required to measure the wafer temperature in the liquid processing appropriately.

Conventionally, as a way to measure the wafer temperature, there is known a method of performing a liquid processing on a test wafer having a sensor therein through the same processes as those for a product wafer, and, then, estimating a temperature of the product wafer in the liquid processing from thus obtained temperature data. In this method, however, the temperatures of the product wafers in the liquid processing cannot be measured individually.

In this regard, there is a demand for a technique capable of investigating, for every product wafer, the temperature of the product wafer in the liquid processing, and capable of appropriately investigating whether the result of the liquid processing upon the product wafer is good or bad.

A substrate processing system according to an exemplary embodiment detects a local temperature (for example, a temperature of a central portion or a temperature of an edge portion, etc.) of a product wafer in a liquid processing by using one or more temperature sensors provided in a processing unit. Further, the substrate processing system according to the exemplary embodiment generates temperature distribution information indicating a temperature distribution within a surface of the product wafer in the liquid processing based on the detected temperature and one or more parameter values which specify processing conditions for the liquid processing.

Further, the substrate processing system according to the exemplary embodiment determines whether the result of the liquid processing is good or bad based on the generated temperature distribution information.

To elaborate, the substrate processing system according to the exemplary embodiment determines whether a result of each of a series of processings (for example, an etching processing, a drying processing, and so forth) included in the liquid processing for each product wafer based on the generated temperature distribution information. Furthermore, the substrate processing system according to the exemplary embodiment may also be capable of determining presence or absence of a difference in the result of the liquid processing between wafers, between processing units or between the lots.

As stated above, in the substrate processing system according to the exemplary embodiment, by measuring, for every product wafer, the temperature distribution within the surface of the product wafer in the liquid processing, it is possible to investigate whether the result of the liquid processing is good or bad for each product wafer. Thus, in the substrate processing system according to the exemplary embodiment, abnormality in the result of the liquid processing and presence of various differences can be found out in early stage, making it possible to reduce production of defective wafers.

<Outline of Substrate Processing System>

A schematic configuration of a substrate processing system 1 (an example of a substrate processing apparatus) according to the exemplary embodiment will be described with reference to FIG. 1. FIG. 1 is a diagram illustrating the schematic configuration of the substrate processing system 1 according to the exemplary embodiment. In the following, in order to clarify positional relationship, the X-axis, the Y-axis and the Z-axis that are orthogonal to each other will be defined, and the positive Z-axis direction will be regarded as a vertically upward direction.

As depicted in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. A plurality of carriers C each of which accommodates therein a plurality of substrates (semiconductor wafers W in the present exemplary embodiment) (hereinafter, referred to as wafers W) horizontally is provided in the carrier placing section 11.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. These processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 are configured to perform a substrate processing on the wafers W transferred by the substrate transfer device 17. Each processing unit 16 holds the transferred wafer W, and performs the substrate processing on the held wafer W. The processing unit 16 performs the substrate processing by supplying a processing liquid onto the held wafer.

The processing liquid may be, for example, an etching liquid. Though not particularly limited, the etching liquid may be HF (Hydro Fluoric acid), HCl (Hydro Chloric acid), TMAH (Tetra Methyl Ammonium Hydroxide), or the like. Alternatively, the processing liquid may be a cleaning liquid such as SC1 (mixed aqueous solution of ammonia and hydrogen peroxide) or DHF (Diluted Hydrofluoric acid). Still alternatively, the processing liquid may be a rinse liquid such as DIW (Deionized water), or a replacement liquid such as IPA (IsoPropyl Alcohol).

Further, the substrate processing system 1 is equipped with a control device 4. The control device 4 is, for example, a computer, and includes a controller 18 and a storage 19. The storage 19 stores a program that controls various processings performed in the substrate processing system 1. The controller 18 controls the operations of the substrate processing system 1 by reading and executing the program stored in the storage 19.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magneto optical disc (MO), or a memory card.

In the substrate processing system 1 configured as described above, the substrate transfer device 13 of the carry-in/out station 2 first takes out a product wafer W (hereinafter, simply referred to as "wafer W") from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W is returned to the carrier C of the carrier placing section 11 by the substrate transfer device 13.

<Configuration of Processing Unit>

Figure 2:
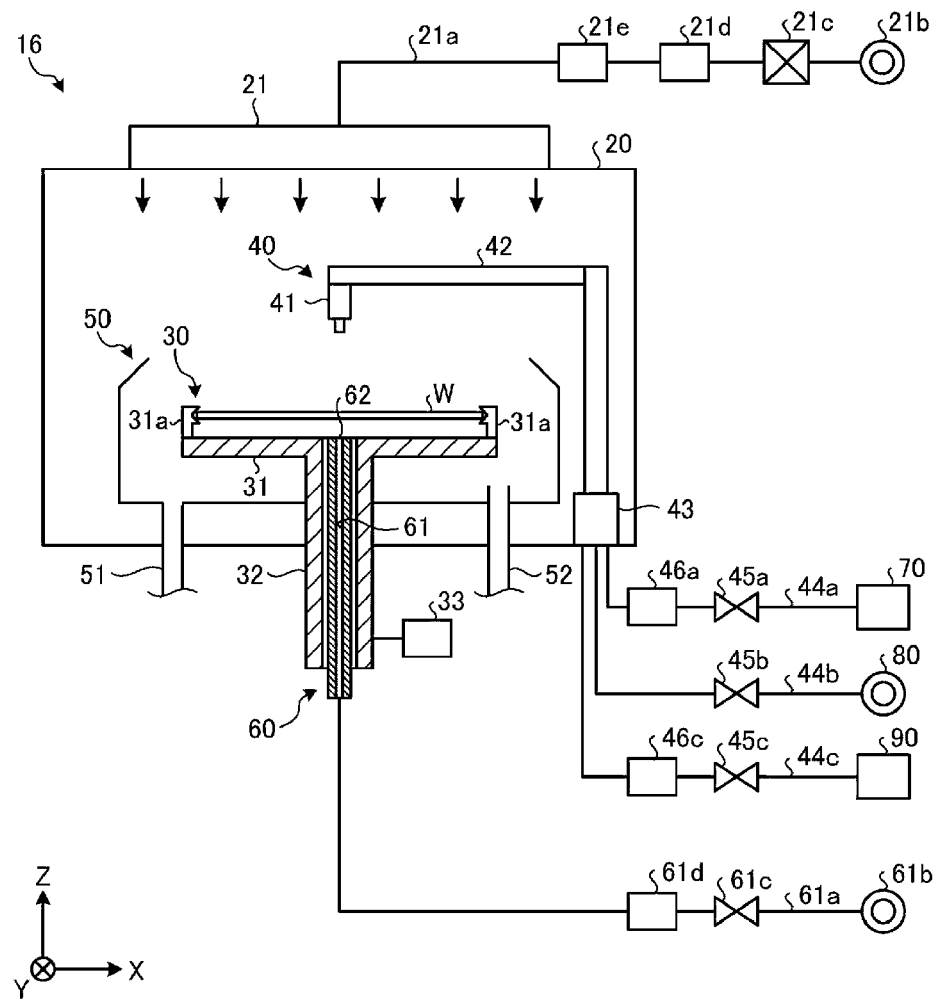
FIG. 2 is a diagram illustrating a configuration of a processing unit according to the exemplary embodiment.

Now, a configuration of the processing unit 16 will be explained with reference to FIG. 2. FIG. 2 is a diagram illustrating a configuration of the processing unit 16 according to the exemplary embodiment.

As shown in FIG. 2, the processing unit 16 is equipped with a chamber 20, a substrate holding mechanism 30, a processing liquid supply 40, a recovery cup 50, and a rear surface supply 60.

The chamber 20 accommodates therein the substrate holding mechanism 30, the processing liquid supply 40, the recovery cup 50, and the rear surface supply 60. A FFU (Fan Filter Unit) 21 is provided at a ceiling of the chamber 20. The FFU 21 is connected to a clean gas source 21b via a supply line 21a, and creates a downflow within the chamber 20 by discharging a clean gas supplied from the clean gas source 21b downwards from the ceiling of the chamber 20. The clean gas may be, by way of non-limiting example, dry air. Further, an inert gas such as $N_2$ (nitrogen) gas or an argon gas may be used as the clean gas. Furthermore, the clean gas supplied from the clean gas source 21b is previously regulated to have a preset temperature and a preset humidity.

The supply line 21a is provided with a valve 21c, a temperature adjuster 21d, and a humidity adjuster 21e. The valve 21c serves to open or close the supply line 21a. The temperature adjuster 21d adjusts a temperature of the clean gas flowing in the supply line 21a. The humidity adjuster 21e adjusts a humidity of the clean gas flowing in the supply line 21a. The valve 21c, the temperature adjuster 21d and the humidity adjuster 21e are provided for each processing unit 16. Accordingly, the substrate processing system 1 according to the exemplary embodiment is capable of adjusting the temperature and the humidity of the clean gas supplied from the FFU into the chamber 20 for the processing units 16 individually.

The substrate holding mechanism 30 is equipped with a holder 31, a supporting column 32, and a driver 33. The holder 31 holds the wafer W horizontally. To be specific, the holder 31 is equipped with a multiple number of grippers 31a, and holds an edge portion of the wafer W with the grippers 31a. The supporting column 32 is vertically extended. A base end of the supporting column 32 is rotatably supported by the driver 33, and the supporting column 32 supports the holder 31 horizontally at a leading end thereof. The driver 33 is configured to rotate the supporting column 32 around a vertical axis. The substrate holding mechanism 30 rotates the supporting column 32 by using the driver 33, thus allowing the holder 31 supported on the supporting column 32 to be rotated, and, accordingly, allowing the wafer W held by the holder 31 to be rotated as well.

The processing liquid supply 40 is configured to supply various processing liquids onto the wafer W. The processing liquid supply 40 is equipped with a nozzle 41 disposed above the wafer W, an arm 42 supporting the nozzle 41, and a moving mechanism 43 configured to move the arm 42.

The nozzle 41 is connected to a chemical liquid supply unit 70 to be described later via a supply line 44a, and discharges a chemical liquid from the chemical liquid supply unit 70 onto a front surface of the wafer W. In the exemplary embodiment, the chemical liquid is an etching liquid.

Further, the nozzle 41 is connected to a rinse liquid source 80 to be described later via a supply line 44b, and supplies a rinse liquid from the rinse liquid source 80 onto the front surface of the wafer W. In the exemplary embodiment, the rinse liquid is DIW.

Furthermore, the nozzle 41 is connected to a replacement liquid supply unit 90 to be described later via a supply line 44c, and discharges a replacement liquid from the replacement liquid supply unit 90 onto the front surface (top surface) of the wafer W. In the exemplary embodiment, the replacement liquid is IPA.

The supply line 44a is provided with a valve 45a and a temperature adjuster 46a. The valve 45a serves to open or close the supply line 44a. The temperature adjuster 46a adjusts a temperature of the etching liquid flowing in the supply line 44a by using, for example, a Peltier device, temperature control water, or the like. Likewise, the supply line 44c is provided with a valve 45c and a temperature adjuster 46c. The valve 45c serves to open or close the supply line 44c. The temperature adjuster 46c adjusts a temperature of the IPA flowing in the supply line 44c.

The valve 45a and the temperature adjuster 46a are provided for each processing unit 16. Accordingly, the substrate processing system 1 according to the exemplary embodiment is capable of adjusting the temperature of the etching liquid supplied from the chemical liquid supply unit 70 in the processing units 16 individually. Likewise, the valve 45c and the temperature adjuster 46c are provided for each processing unit 16. Accordingly, the substrate processing system 1 according to the exemplary embodiment is capable of adjusting the temperature of the IPA supplied from the replacement liquid supply unit 90 in the processing unit 16 individually. Furthermore, the supply line 44b is provided with a valve 45b configured to open or close the supply line 44b.

The recovery cup 50 is disposed to surround the holder 31, and collects the processing liquid scattered from the wafer W when the holder 31 is rotated. A drain port 51 is formed at a bottom of the recovery cup 50, and the processing liquid collected by the recovery cup 50 is drained from the drain port 51 to the outside of the processing unit 16. Further, an exhaust port 52 is formed at the bottom of the recovery cup 50 to exhaust the gas supplied from the FFU 21 to the outside of the processing unit 16.

The rear surface supply 60 is disposed in, for example, a hollow portion vertically formed through the holder 31 and the supporting column 32. A vertically extended flow path 61 is formed within the rear surface supply 60. An upper end of the flow path 61 is formed as a discharge opening 62 opened toward a rear surface of the wafer W.

The flow path 61 of the rear surface supply 60 is connected to a temperature control liquid source 61b via a supply line 61a. The rear surface supply 60 discharges the temperature control liquid from the temperature control liquid source 61b toward the rear surface of the wafer W through the discharge opening 62. In the exemplary embodiment, the temperature control liquid is HDIW (Hot DIW), that is, DIW heated to a predetermined temperature.

The supply line 61a is provided with a valve 61c and a temperature adjuster 61d. The valve 61c serves to open or close the supply line 61a. The temperature controller 61d adjusts a temperature of the temperature control liquid flowing in the supply line 61a. The valve 61c and the temperature adjuster 61d are provided for each processing unit 16. Accordingly, the substrate processing system 1 according to the exemplary embodiment is capable of adjusting the temperature of the temperature control liquid supplied from the rear surface supply 60 to the rear surface of the wafer W in the processing units 16 individually.

<Example Layout of Temperature Sensors>

Figure 3:
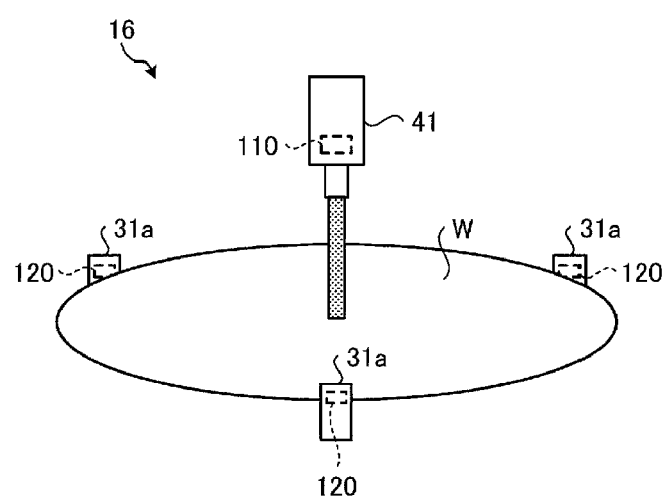
FIG. 3 is a diagram illustrating an example layout of temperature sensors according to the exemplary embodiment.

An example layout of temperature sensors configured to detect a local temperature of the wafer W in the liquid processing will be explained with reference to FIG. 3. FIG. 3 is a diagram illustrating the example layout of the temperature sensors according to the exemplary embodiment.

As depicted in FIG. 3, the processing unit 16 includes a first temperature sensor 110 and a plurality of second temperature sensors 120. The first temperature sensor 110 is provided in the nozzle 41, and detects a temperature of the processing liquid within the nozzle 41. The processing liquid supplied from the nozzle 41 is discharged onto a central portion of the wafer W. Thus, the temperature detected by the first temperature sensor 110 may be regarded as a temperature of the central portion of the wafer W in the liquid processing. Further, the first temperature sensor 110 need not necessarily be provided at the nozzle 41 as long as it is provided downstream of the temperature adjusters 46a and 46c in the processing liquid supply 40.

The second temperature sensors 120 are provided at the grippers 31a of the substrate holding mechanism 30 (see FIG. 2) to detect temperatures of leading ends (portions to be in contact with the wafer W) of the grippers 31a. FIG. 3 illustrates an example where the substrate holding mechanism 30 has three grippers 31a, and one second temperature sensor 120 is provided at the corresponding one of three grippers 31a. The grippers 31a are in contact with the edge portion of the wafer W. Thus, the temperature of the gripper 31a detected by each second temperature sensor 120 may be regarded as a temperature of the edge portion of the wafer W in the liquid processing.

Further, the processing unit 16 only needs to be equipped with at least one second temperature sensor 120. That is, the second temperature sensor 120 needs to be provided at one of the plurality of grippers 31a at least. Further, the second temperature sensor 120 is not limited to being provided at the gripper 31a as long as it is provided at a member which comes into contact with the edge portion of the wafer W.

<Configuration of Replacement Liquid Supply Unit>

Figure 4:
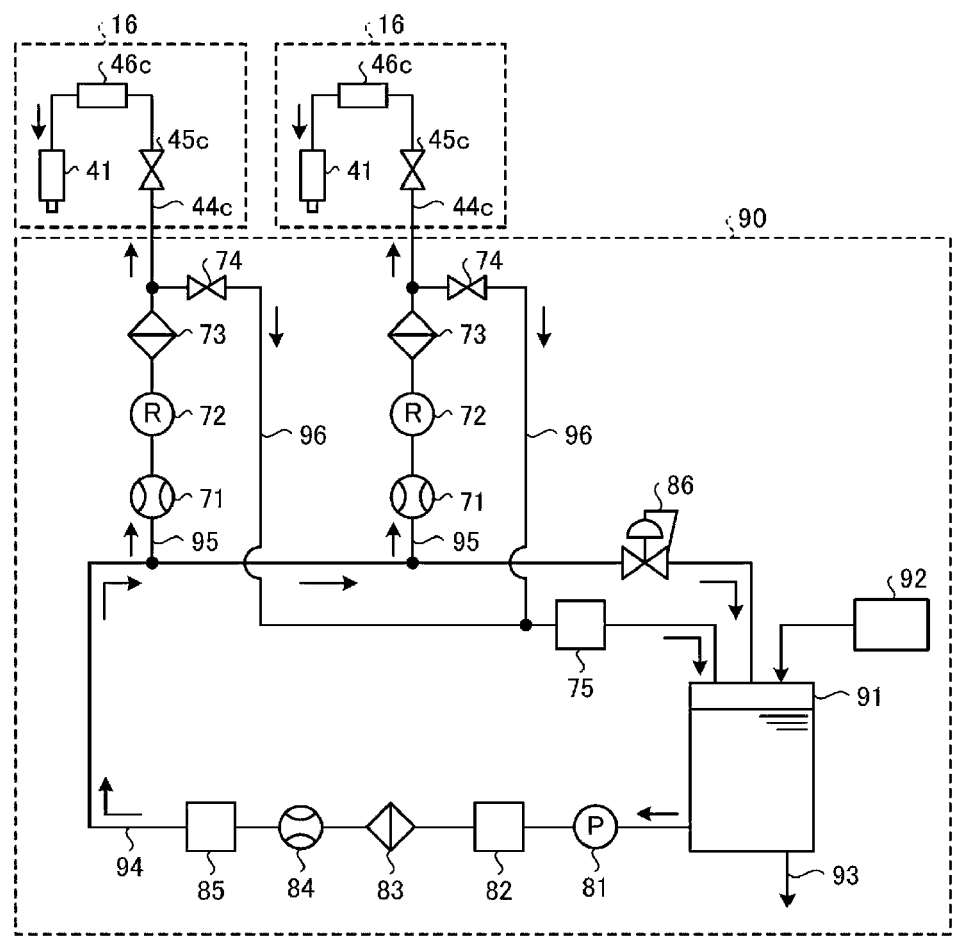
FIG. 4 is a diagram illustrating a configuration of a replacement liquid supply unit according to the exemplary embodiment.

Now, the replacement liquid supply unit 90 will be explained with reference to FIG. 4. FIG. 4 is a diagram illustrating a configuration of the replacement liquid supply unit 90 according to the exemplary embodiment. Although FIG. 4 illustrates an example where two of the processing units 16 are connected to the replacement liquid supply unit 90, the number of the processing units 16 connected to the single replacement liquid supply unit 90 is not limited to the present example. Furthermore, the chemical liquid supply unit 70 configured to supply the etching liquid to the processing unit(s) 16 may have the same configuration as the replacement liquid supply unit 90.

The replacement liquid supply unit 90 is equipped with a tank 91, a replenishing device 92, a drain line 93, a circulation line 94, a supply line 95, and a return line 96.

The tank 91 stores the IPA therein. The replenishing device 92 supplies new IPA to the tank 91. For example, the replenishing device 72 supplies the new IPA into the tank 91 when replacing the IPA of the tank 91 or when an amount of the IPA within the tank 91 falls below a certain amount. The drain line 93 serves to drain the IPA from the tank 91 when replacing the IPA within the tank 91.

Both ends of the circulation line 94 is connected to the tank 91, and the circulation line 94 serves to return the IPA sent from the tank 91 back into the tank 91. The circulation line 94 is configured to allow the IPA to flow to the outside of the tank 91 and then return to the tank 91.

The circulation line 94 is provided with a pump 81, a heater 82, a filter 83, a flowmeter 84, a temperature sensor 85, and a backpressure valve 86. These components are arranged in the order of the pump 81, the heater 82, the filter 83, the flowmeter 84, the temperature sensor 85 and the backpressure valve 86 from the upstream side in a flow direction of the IPA with respect to the tank 91.

The pump 81 is configured to force-feed the IPA in the circulation line 94. The force-fed IPA circulates through the circulation line 94 and is returned back into the tank 91.

The heater 82 is provided in the circulation line 94 to adjust a temperature of the IPA. To be specific, the heater 82 heats the IPA. The heater 82 controls a heating amount of the IPA based on a signal from the control device 4 to adjust the temperature of the IPA. For example, the heating amount of the IPA by the heater 82 is adjusted based on a temperature of the IPA detected by the temperature sensor 85.

By way of example, the control device 4 adjusts the temperature of the IPA to a certain temperature by controlling the heater 82. The certain temperature is a temperature allowing the IPA discharged from the nozzle of the processing liquid supply 40 onto the wafer W in the supply thereof to have a preset processing temperature. The certain temperature is a temperature set based on a thermal capacity of a filter 73 provided in the supply line 95 or the like.

The filter 83 removes a foreign substance which is a contaminant such as a particle included in the IPA flowing in the circulation line 94. The flowmeter 84 measures a flow rate of the IPA flowing in the circulation line 94. The temperature sensor 85 detects the temperature of the IPA flowing in the circulation line 94. The temperature sensor 85 is provided in the circulation line 94 upstream of a point to which the supply line 95 is connected.

The backpressure valve 86 increases a degree of valve openness thereof when a pressure of the IPA at the upstream of the backpressure valve 86 is larger than a certain pressure. The backpressure valve 86 decreases the degree of valve openness when the pressure of the IPA at the upstream of the backpressure valve 86 is smaller than the certain pressure. The backpressure valve 86 functions to maintain the pressure of the processing liquid at the upstream side thereof at the certain pressure. The certain pressure is a previously set pressure. The degree of valve openness of the backpressure valve 86 is controlled by the control device 4.

By controlling the degree of valve openness of the backpressure valve 86, the flow rate of the IPA in the circulation line 94 can be adjusted. That is, the backpressure valve 86 is provided in the circulation line 94, and serves to adjust the flow rate of the IPA returning to the tank 91 through the circulation line 94. Further, the flow rate of the IPA in the circulation line 94 may be adjusted by controlling a discharge pressure of the pump 81. The flow rate of the IPA in the circulation line 94 is controlled based on the flow rate of the IPA detected by the flowmeter 84.

The supply line 95 is connected to the circulation line 94. The supply line 95 is connected to the circulation line 94 downstream of the temperature sensor 85 and upstream of the backpressure valve 86. The supply line 95 includes a plurality of supply lines, and these supply lines 95 are provided to correspond to the plurality of processing liquid supplies 40. Each supply line 95 is branched off from the circulation line 94 and configured to be capable of supplying the IPA to the corresponding one of the processing liquid supplies 40. Here, although the supply line 95 of the replacement liquid supply unit 90 and the supply line 44c of the processing unit 16 are described as different supply lines, they may be implemented by one and the same supply line.

The supply line 95 is provided with a flowmeter 71, a constant-pressure valve 72, and the filter 73. They are arranged in the order of the flowmeter 71, the constant-pressure valve 72 and the filter 73 in the flow direction of the IPA flowing from the circulation line 94 to the processing liquid supply 40.

The flowmeter 71 measures the flow rate of the IPA flowing in the supply line 95. The constant-pressure valve 72 adjusts the pressure of the IPA at the downstream of the constant-pressure valve 72. By way of example, the constant-pressure valve 72 adjusts the pressure of the IPA such that the discharge amount of the IPA discharged from the nozzle of the processing liquid supply 40 becomes a certain discharge amount. That is, the constant-pressure valve 72 adjusts the flow rate of the IPA discharged from the nozzle of the processing liquid supply 40. The certain discharge amount is a previously set amount, and is set based on a processing condition for the wafer W. The constant-pressure valve 72 adjusts the pressure of the IPA based on a signal from the control device 4.

The filter 73 is provided in the supply line 95 upstream of a connection point where the return line 96 and the supply line 95 are connected. The filter 73 is provided in the supply line 95 downstream of the constant-pressure valve 72. The filter 73 removes a foreign substance which is a contaminant such as a particle included in the IPA flowing in the supply line 95.

The return line 96 is connected to the supply line 95 to return the IPA to the tank 91 from the supply line 95. The return line 96 is connected to the supply line 95 at a connection point between the filter 73 and the valve 45c. The return line 96 includes a plurality of return lines, and these return lines 96 are provided to correspond to the plurality of processing liquid supplies 40. Each return line 96 is provided with a valve 74.

The valve 74 serves to switch on and off of the flow of the IPA in the return line 96. If the valve 74 is opened, the IPA flows from the supply line 95 into the return line 96. The IPA flowing in the return line 96 is returned back into the tank 91. If the valve 74 is closed, the IPA does not flow into the return line 96. The valve 74 is opened or closed based on a signal from the control device 4.

The plurality of return lines 96 join each other at the downstream of the valves 74 in the flow direction of the IPA flowing in the return lines 96, and are connected to the tank 91. A temperature sensor 75 is provided in the return line 96 downstream of a point where the plurality of return lines 96 are connected. The temperature sensor 75 detects a temperature of the IPA returning to the tank 91 from the return line 96. Further, the return line 96 may be connected to the circulation line 94 downstream of the backpressure valve 86.

The control device 4 controls the valve 74 provided in the return line 96 to be closed and the valve 45c provided in the processing unit 16 to be opened in a supply mode in which the IPA is supplied to the wafer W from the processing liquid supply 40. Accordingly, the IPA is discharged from the nozzle of the processing liquid supply 40 without flowing into the return line 96. Meanwhile, in a standby mode in which the IPA is not supplied to the wafer W from the processing liquid supply 40, the control device 4 controls the valve 45c provided in the processing unit 16 to be closed and the valve 74 provided in the return line 96 to be opened. As a result, the IPA is returned back into the tank 91 through the return line 96 without being discharged from the processing liquid supply 40.

As stated above, in the substrate processing system 1 according to the exemplary embodiment, the IPA adjusted to the certain temperature by using the replacement liquid supply unit 90 can be supplied to the plurality of processing units 16. Further, in the substrate processing system 1 according to the exemplary embodiment, the temperature of the IPA can be adjusted in the processing units 16 individually, using the temperature adjusters 46c respectively provided in the processing units 16.

<Configuration of Control Device>

Figure 5:
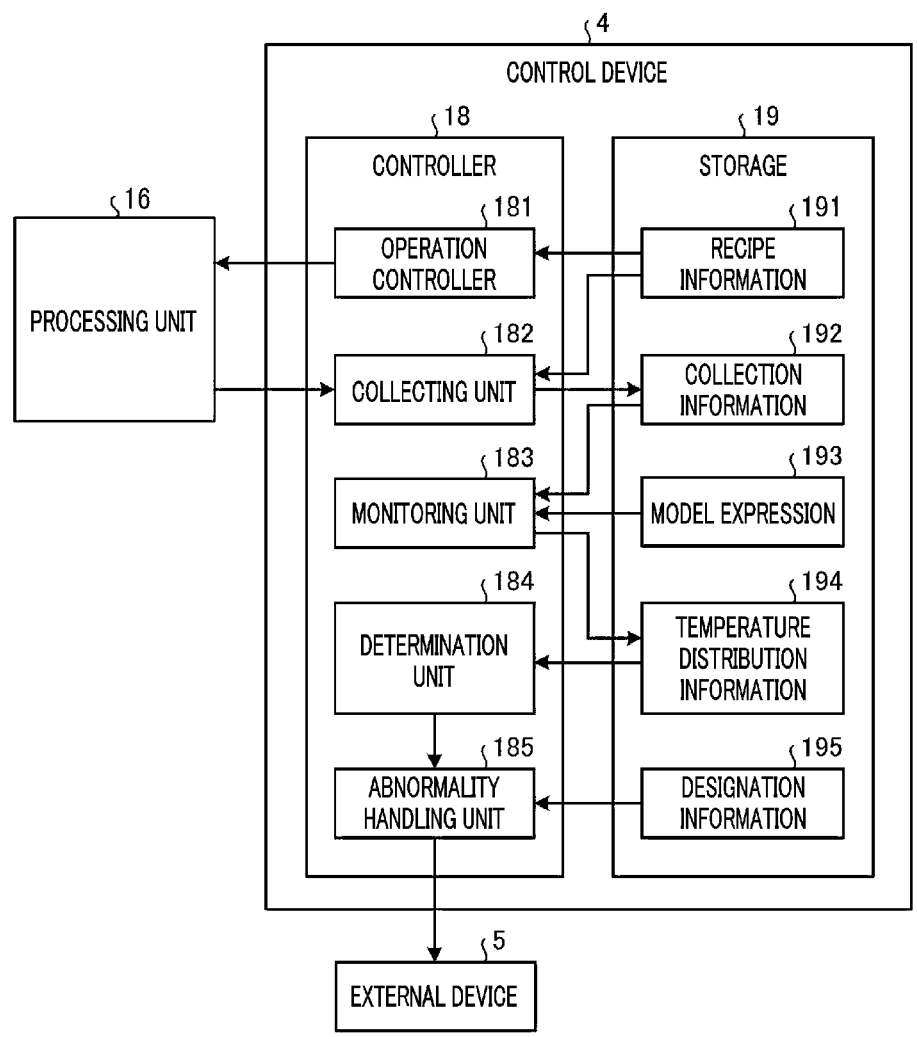
FIG. 5 is a block diagram illustrating a configuration of a control device according to the exemplary embodiment.

Now, a configuration of the control device 4 according to the exemplary embodiment will be described with reference to FIG. 5. FIG. 5 is a block diagram illustrating the configuration of the control device 4 according to the exemplary embodiment.

As depicted in FIG. 5, the control device 4 according to the exemplary embodiment includes the controller 18 and the storage 19.

The storage 19 is implemented by, for example, a semiconductor memory device such as a RAM (Random Access Memory) or a flash memory, or a storage device such as a hard disk or an optical disk. The storage 19 stores therein recipe information 191, collection information 192, a model expression 193, temperature distribution information 194, and designation information 195.

The controller 18 is implemented by, for example, a CPU (Central Processing Unit) or MPU (Micro Processing Unit) which executes various programs stored in a storage (for example, the storage 19) within the control device 4 by using a RAM as a working area. Further, the controller 18 may be implemented by an integrated circuit such as, but not limited to, an ASIC (Application Specific Integrated Circuit) or a FPGA (Field Programmable Gate Array).

The controller 18 includes an operation controller 181, a collecting unit 182, a monitoring unit 183, a determination unit 184 and an abnormality handling unit 185, and implements or carries out a function and an operation of a processing to be described below. Further, the internal configuration of the controller 18 is not limited to the example shown in FIG. 5, and the controller 18 may have various other configurations as long as it is capable of carrying out a substrate processing to be described below. Furthermore, a connection relationship between the individual processors belonging to the controller 18 is not limited to the example shown in FIG. 5, and may be different.

The operation controller 181 controls the processing unit 16 based on the recipe information 191 stored in the storage 19, thus allowing the processing unit 16 to perform a series of liquid processings upon the wafer W.

The recipe information 191 is information indicating the content and the sequence of the liquid processings performed in the processing unit 16, and includes multiple parameter values defining processing conditions for the liquid processings. By way of example, the recipe information 191 includes parameter values such as a processing time, a rotation number of the wafer W, a kind of the processing liquid, a discharge flow rate of the processing liquid, a discharge temperature of the processing liquid, and so forth. These parameter values are specified for each processings included in the liquid processings.

Figure 6:
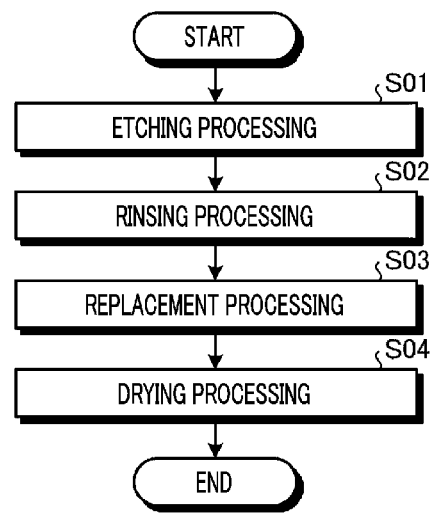
FIG. 6 is a flowchart illustrating a sequence of liquid processings performed by the processing unit according to the exemplary embodiment.

Here, an example of the liquid processings performed under the control of the operation controller 181 will be explained with reference to FIG. 6. FIG. 6 is a flowchart illustrating a sequence of the liquid processing performed by the processing unit 16 according to the exemplary embodiment. The series of liquid processings shown in FIG. 6 are performed according to the recipe information 191.

First, the processing unit 16 holds the wafer W, which is carried into the chamber 20 by the substrate transfer device 17 (see FIG. 1), by using the holder 31 of the substrate holding mechanism 30. To elaborate, the processing unit 16 holds the edge portion of the wafer W with the plurality of grippers 31a. Then, the processing unit 16 rotates the holder 31 around the vertical axis by using the driver 33, thus allowing the wafer W to be rotated.

Then, the processing unit 16 performs an etching processing (process S01). First, in the etching processing, the nozzle 41 is located above the center of the wafer W by using the moving mechanism 43 of the processing liquid supply 40. Then, the processing unit 16 opens the valve 45a to supply the etching liquid from the nozzle 41 onto the front surface of the wafer W being rotated. The etching liquid supplied to the center of the wafer W is diffused onto the entire front surface of the wafer W as the wafer W is rotated. Accordingly, the front surface of the wafer W is etched. Thereafter, the processing unit 16 closes the valve 45a, thus stopping the supply of the etching liquid onto the wafer W.

Subsequently, the processing unit 16 carries out a rinsing processing (process S02). In the rinsing processing, the valve 45b is opened, thus allowing the DIW to be supplied from the nozzle 41 onto the front surface of the wafer W being rotated. The DIW supplied to the center of the wafer W is diffused onto the entire front surface of the wafer W as the wafer W is rotated. Accordingly, the etching liquid remaining on the front surface of the wafer W is washed away by the DIW. Then, the processing unit 16 closes the valve 45b, thus stopping the supply of the DIW onto the wafer W.

Next, the processing unit 16 performs a replacement processing (process S03). In the replacement processing, the valve 45c is opened, thus allowing the IPA to be supplied from the nozzle 41 onto the front surface of the wafer W being rotated. The IPA supplied to the center of the wafer W is diffused onto the entire front surface of the wafer W as the wafer W is rotated. Accordingly, the DIW left on the front surface of the wafer W is replaced by the IPA. Then, the processing unit 16 closes the valve 45c, thus stopping the supply of the IPA onto the wafer W.

Then, the processing unit 16 performs a drying processing (process S04). In the drying processing, the wafer W is dried by being rotated at a speed higher than a rotation speed in the processes S01 to S03 by using the driver 33. Then, the wafer W is carried out of the chamber 20 by the substrate transfer device 17. Then, the series of liquid processings upon the single sheet of wafer W are completed.

Reference is made back to FIG. 5. During the liquid processings, the collecting unit 182 acquires temperature data from the first temperature sensor 110 of the processing unit 16, and stores the acquired temperature data in the storage 19 as an item of "center temperature" in the collection information 192. By way of example, the collecting unit 182 calculates, for each of the processings (the etching processing, the rinsing processing, the replacement processing, and the drying processing) included in the liquid processings, an average value of the temperatures detected by the first temperature sensor 110 in each processing, and stores the calculated average value in the storage 19 as a "center temperature" of the wafer W in each processing.

Further, during the liquid processings, the collecting unit 182 acquires temperature data from the second temperature sensor 120 of the processing unit 16, and stores the acquired temperature data in the storage 19 as an item of "edge temperature" in the collection information 192. By way of example, the collecting unit 182 calculates, for each of the processings included in the liquid processings, an average value of temperatures detected by the second temperature sensor 120 in each processing, and stores the calculated average value in the storage 19 as an "edge temperature" of the wafer W in each processing.

The collecting unit 182 also collects information other than the center temperature and the edge temperature. By way of example, the collecting unit 182 acquires a temperature within the chamber 20, and stores this acquired temperature in the storage 19 as an item of "space temperature" in the collection information 192. The temperature within the chamber 20 may be acquired by, for example, a non-illustrated temperature sensor provided within the chamber 20, or may be acquired from the set temperature of the clean gas in the clean gas source 21b.

Furthermore, the collecting unit 182 also acquires humidity within the chamber 20, and stores the acquired humidity in the storage 19 as an item of "space humidity" in the collection information 192. The humidity within the chamber 20 may be acquired by, for example, a non-illustrated humidity sensor provided within the chamber 20, or may be acquired from the set humidity of the clean gas in the clean gas source 21b.

In addition, the collecting unit 182 collects information upon the discharge flow rate and the rotation number from the recipe information 191, and stores the acquired information in the storage 19 as an item of "discharge flow rate" and an item of "rotation number" in the collection information 192, respectively. Further, the collecting unit 182 may collect a detection result of the flow rates from non-illustrated flowmeters provided in the supply lines 44a to 44c, for example, and may store the acquired detection result as the item of "discharge flow rate" in the storage 19. Furthermore, the collecting unit 182 may also collect a detection result of a rotation number from a non-illustrated rotation sensor such as a rotary encoder configured to detect a rotation number of the supporting column 32, for example, and may store the acquired detection result in the storage 19 as the item of "rotation number."

Besides, the collecting unit 182 may also collect information such as, but not limited to, an exhaust flow rate of the chamber 20, a density of the processing liquid, and a thermal capacity of the processing liquid, and may store the collected information in the storage 19 as the collection information 192.

FIG. 7 is a diagram illustrating an example of the collection information 192 according to the exemplary embodiment. As depicted in FIG. 7, the collection information 192 is information in which individual items of 'wafer ID,' 'lot ID,' 'unit ID,' 'processing content,' 'center temperature,'

'edge temperature,' 'space temperature,' 'space humidity,' 'discharge flow rate,' and 'rotation number' are related to each other.

Identification information of the wafer W is stored in the item of 'wafer ID.' Identification information of a lot to which the wafer W belongs is stored in the item of 'lot ID.' Here, the lot is a manufacturing unit for product wafers. For example, a set of twenty five sheets of wafers W may be referred to as one lot. Identification information of the processing unit 16 which has processed the wafer W is stored in the item of 'unit ID.' Information for identifying the content of the liquid processings is stored in the item of 'processing content.' Further, in FIG. 7, 'S101' is an example of identification information of the etching processing; 'S102,' an example of identification information of the rinsing processing; 'S103,' an example of identification information of the replacement processing; and 'S104', an example of identification information of the drying processing.

The 'center temperature' refers to a temperature of the central portion of the wafer W during the liquid processing. Information based on temperature data obtained by the first temperature sensor 110 (for example, an average value of temperature data detected during the processing) is stored in the item of 'center temperature.' The 'edge temperature' refers to a temperature of the edge portion of the wafer W during the liquid processing. Information based on temperature data obtained by the second temperature sensors 120 (for example, an average value of temperature data detected during the processing) is stored in the item of 'edge temperature.'

The 'space temperature' refers to a temperature within the chamber 20, and the 'space humidity' refers to a humidity within the chamber 20. For example, a temperature and a humidity detected by a non-illustrated temperature sensor and a non-illustrated humidity sensor provided within the chamber 20 are stored in the items of 'space temperature' and 'space humidity,' respectively.

The 'discharge flow rate' refers to a discharge flow rate of the processing liquid, and the 'rotation number' refers to a rotation number of the wafer W. By way of example, information of the discharge flow rate and information of the rotation number acquired from the recipe information 191 are stored in the items of 'discharge flow rate' and 'rotation number,' respectively.

The monitoring unit 183 monitors an in-surface temperature distribution of the wafer W during the liquid processing. To elaborate, by using the model expression 193 and the collection information 192 stored in the storage 19, the monitoring unit 183 generates the temperature distribution information 194 indicating the in-surface temperature distribution of the wafer W during the liquid processing, and stores the generated temperature distribution information 194 in the storage 19.

Here, the model expression 193 is a model expression for estimating the in-surface temperature distribution of the wafer W during the liquid processing. To elaborate, the model expression 193 is one for estimating a temperature distribution within the entire surface of the wafer W from the local temperatures of the wafer W detected by the first and second temperature sensors 110 and 120, using known parameter values. Further, from another point of view, the model expression 193 is one for correcting theoretical values of the in-surface temperature distribution of the wafer W derived from known processing conditions (parameters values) based on actual measurement values (sensor values).

Upon the completion of the series of liquid processings upon the wafer W, the monitoring unit 183 acquires the collection information 192 upon the wafer W after being subjected to the liquid processing from the storage 19. Then, the monitoring unit 183 puts the parameter values and the sensor values included in the acquired collection information 192 into the model expression 193, thus producing the temperature distribution information 194 indicating the in-surface temperature distribution of the wafer W during the liquid processing.

To be specific, temperatures at multiple points in a range from the central portion to the edge portion of the wafer W are obtained by using the model expression 193. The monitoring unit 183 generates the temperature distribution information 194 by estimating temperatures between adjacent points among the multiple points by using, for example, regression analysis (curve fitting), and stores the generated temperature distribution information 194 in the storage 19. The monitoring unit 183 generates the temperature distribution information 194 for each of the processings included in the liquid processings.

Figure 8:
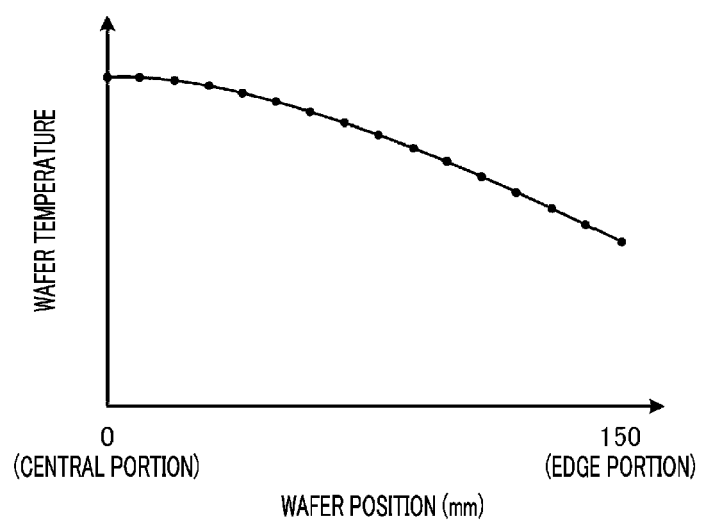
FIG. 8 is a diagram illustrating an example of temperature distribution information according to the exemplary embodiment.

FIG. 8 is a diagram illustrating an example of the temperature distribution information 194 according to the exemplary embodiment. FIG. 8 shows an example of the temperature distribution information 194 of a wafer W having a diameter of 300 mm. A horizontal axis of a graph of FIG. 8 represents a wafer position, which indicates a distance from the center of the wafer W set as a reference point (0 mm).

As depicted in FIG. 8, the temperature distribution information 194 is information indicating temperatures (wafer temperatures) at respective positions (wafer positions) along a diametrical direction of the wafer W during the processing. By way of example, in FIG. 8, black circles are data obtained from the model expression 193, and a line connecting the black circles is data interpolated by the regression analysis, or the like. Further, FIG. 8 illustrates the temperature distribution information 194 in the form of a graph to ease understanding. However, the temperature distribution information 194 need not necessarily be in the form of the graph.

The determination unit 184 determines whether the result of the liquid processing performed on the wafer W is good or bad, based on the temperature distribution information 194 stored in the storage 19. The determination unit 184 makes this determination for each of the processings (the etching processing, the rinsing processing, the replacement processing, and the drying processing) included in the liquid processings.

Figure 9:
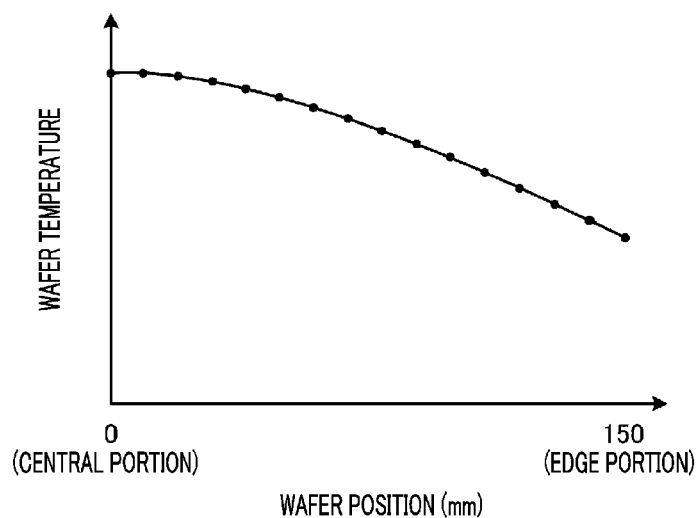
FIG. 9 is a diagram illustrating an example of an etching rate conversion processing.
Figure 9:
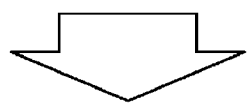
Figure 9:
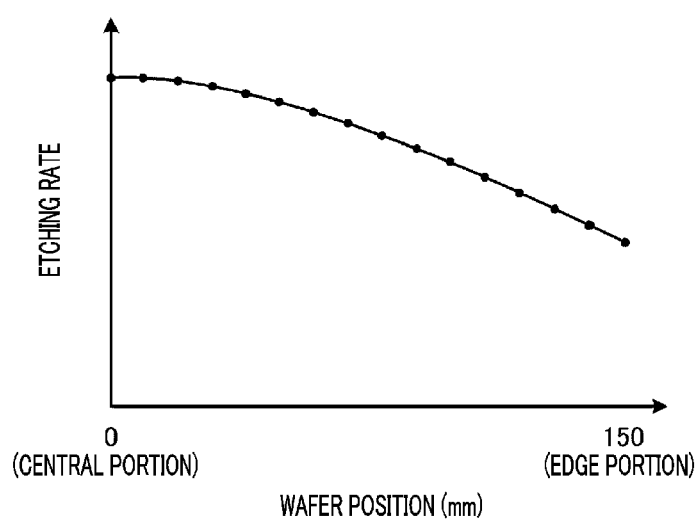
Figures 12, 13:
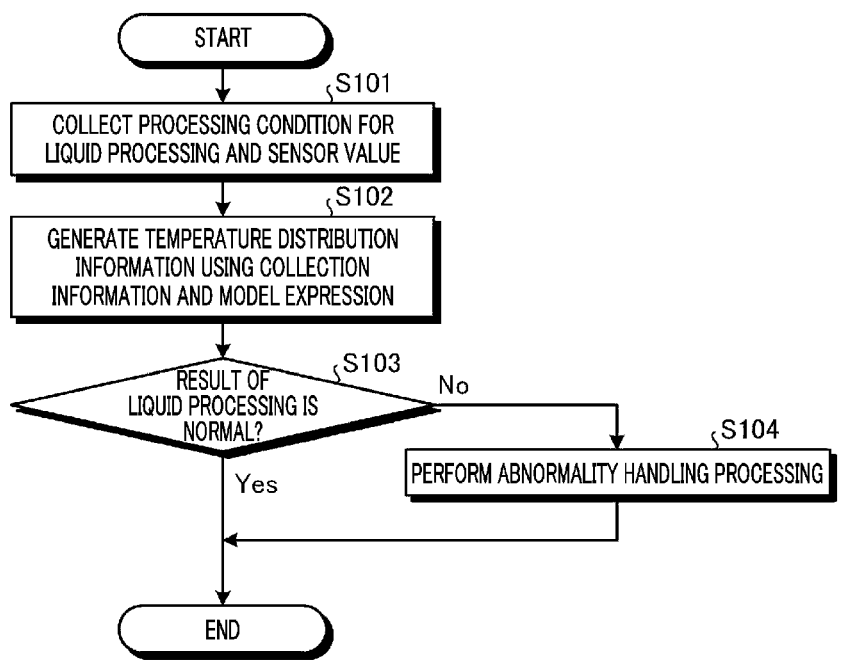
FIG. 12 is a diagram illustrating an example of determining presence or absence of a difference between lots.
FIG. 13 is a flowchart illustrating a sequence of a monitoring processing according to the exemplary embodiment.

Here, an example of the good or bad determination upon the result of the etching processing will be explained with reference FIG. 9 to FIG. 12. FIG. 9 is a diagram showing an example of an etching rate conversion processing. FIG. 10 is a diagram illustrating an example of determining presence or absence of a difference between the wafers W. FIG. 11 is a diagram illustrating an example of determining presence or absence of a difference between the processing units 16. FIG. 12 is a diagram illustrating an example of determining presence or absence of a difference between the lots.

As shown in FIG. 9, the determination unit 184 converts the temperature distribution information 194 into etching rate distribution information by using sensitivity data indicating a relationship between the temperature and the etching rate. The etching rate distribution information is information indicating etching rates (A/min) at respective positions (wafer positions) along the diametrical direction of the wafer W. The etching rate distribution information is stored in the storage 19 by being matched with, for example, the wafer ID, the lot ID, the unit ID, and the like.

Then, based on the etching rate distribution information, the determination unit 184 determines whether the result of the etching processing is good or bad. By way of example, the determination unit 184 calculates an average value of the etching rates in the entire surface of the wafer W by using the etching rate distribution information. Then, the determination unit 184 determines whether the calculated average value exceeds a previously set threshold value. If the calculated average value exceeds the threshold value, the determination unit 184 makes a determination that the result of the etching processing is normal, whereas if it is below the threshold value, the determination unit 184 makes a determination that the result of the etching processing is abnormal.

Further, the determination unit 184 also calculates a difference rate between a maximum value and a minimum value of the etching rates, referring to the etching rate distribution information. For example, the determination unit 184 calculates, as the difference rate, a ratio of a difference between the maximum value and the minimum value with respect to the maximum value. The determination unit 184 then determines whether the calculated difference rate is below a previously set threshold value. If the calculated difference rate is below the threshold value, the determination unit 184 makes a determination that in-surface uniformity of the etching processing is normal. If, however, the calculated difference rate is equal to or larger than the threshold value, the determination unit 184 makes a determination that the in-surface uniformity of the etching processing is abnormal.

As stated above, the determination unit 184 is capable of determining, for each wafer W, whether the result of the etching processing upon the wafer W is good or bad, based on the temperature distribution information 194 of the corresponding wafer W.

Moreover, the determination unit 184 may determine presence or absence of a difference in the etching processing between the wafers W. For example, FIG. 10 shows an example result of an etching average value and etching uniformity for each of four wafers W with wafer IDs of 'W1,' 'W2,' 'W3,' and 'W4.' In FIG. 10, the etching average value is the above-described average value of the etching rates, and the etching uniformity is the above-described difference rate of the etching rates. The etching average values and the etching uniformity of the four wafers W shown in FIG. 10 are all values regarded as being normal.

As depicted in FIG. 10, the etching average value and the etching uniformity of the wafer W with the wafer ID of 'W4' are different from those of the other three wafers W. In such a case, the determination unit 184 makes a determination that there is generated a difference in the etching processing (etching average value and etching uniformity) of the wafer W with the wafer ID of 'W4' with respect to the other wafers W.

As an example, the determination unit 184 accumulates information upon the etching average values and the etching uniformity of wafers W processed in the past, and calculates, from the accumulated information, reference values (for example, average values) for the etching average values and the etching uniformity. Then, the determination unit 184 calculates, for each wafer W, a difference in the etching average value and a difference in the etching uniformity of this wafer W from the reference values. If any of the calculated difference exceeds a previously set threshold value, the determination unit 184 makes a determination that there is generated the difference between the wafers W.

Furthermore, the determination unit 184 may also determine presence or absence of the difference in the etching processing between the processing units 16. For example, FIG. 11 shows an average value of the etching average values and an average value of the etching uniformity of a multiple number of wafers W processed in each of four processing units 16 with unit IDs of 'U1,' 'U2,' 'U3,' and 'U4.' Below, the average value of the etching average values and the average value of the etching uniformity of the multiple number of wafers W processed in any of the processing units 16 will be referred to as an etching average value and etching uniformity of the corresponding processing unit 16.

As depicted in FIG. 11, the etching average value and the etching uniformity of the processing unit 16 with the unit ID of 'U4' are different from those of the other three processing units 16. In such a case, the determination unit 184 makes a determination that there is generated a difference in the etching average value and the etching uniformity of the processing unit 16 with the unit ID of 'U4' with respect to the other processing units 16.

As an example, the determination unit 184 accumulates, for each processing unit 16, information upon the etching average values and the etching uniformity of the wafers W processed in the past, and calculates, for each processing unit 16, an average value of the etching average values and an average value of the etching uniformity from the accumulated information. Further, the determination unit 184 acquires a reference value for the etching average values and a reference value for the etching uniformity by calculating average values of the calculated average values for the respective processing units 16. Then, the determination unit 184 calculates, for each processing unit 16, a difference of the etching average value from the corresponding reference value and a difference of the etching uniformity from the corresponding reference value. If any of the calculated differences exceeds a previously set threshold value, the determination unit 184 makes a determination that there is generated a difference between the processing units 16.

In addition, the determination unit 184 may also determine presence or absence of the difference in the etching processing between the lots. For example, FIG. 12 shows average values of the etching average values and the etching uniformity of a multiple number of wafers W belonging to each of four lots with lot IDs of 'L1,' 'L2,' 'L3,' and 'L4.' Below, the average values of the etching average values and the etching uniformity of the multiple number of wafers W included in any of the lots will be referred to as an etching average value and etching uniformity of the corresponding lot.

As depicted in FIG. 12, the etching average value and the etching uniformity of the lot with the lot ID of 'L4' are different from those of the other three lots. In such a case, the determination unit 184 makes a determination that there is generated a difference in the etching average value and the etching uniformity in the lot with the lot ID of 'L4' with respect to the other lots.

As an example, the determination unit 184 accumulates, for each lot, information upon etching average values and the etching uniformity of the multiple number wafers W included in the corresponding lot, and calculates, for each lot, an average value of the etching average values and an average value of the etching uniformity from the accumulated information. Further, the determination unit 184 acquires a reference value for the etching average values and a reference value for the etching uniformity by calculating average values of the calculated average values for the respective lots. Then, the determination unit 184 calculates, for each lot, a difference of the etching average value from the corresponding reference value and a difference of the etching uniformity from the corresponding reference value. If any of the calculated difference exceeds a previously set threshold value, the determination unit 184 makes a determination that there is generated a difference between the lots.

Additionally, the determination unit 184 also determines whether the result of the drying processing is good or bad. To elaborate, based on the temperature distribution information 194, the determination unit 184 determines presence or absence of condensation on the wafer W in the drying processing. This will be elaborated later.

The abnormality handling unit 185 performs a preset abnormality handling processing when abnormality of the liquid processing is determined by the determination unit 184.

By way of example, the abnormality handling unit 185 may perform a processing of changing the processing condition for the liquid processing as the abnormality handling processing.

Here, the designation information 195 specifying changeable processing conditions is stored in the storage 19. The designation information 195 may be appropriately altered by, for example, a user of the substrate processing system 1. The abnormality handling unit 185 may change the processing conditions designated by the designation information 195 such that results of subsequent liquid processings fall within a normal range.

By way of example, assume that there is generated, in one of the processing units 16, the difference between the processing units 16. In such a case, the abnormality handling unit 185 may change the discharge temperature of the etching liquid in the corresponding processing unit 16 having the difference. This may be accomplished by, for example, changing parameter values designating the heating temperature by the temperature adjuster 46a. To elaborate, the abnormality handling unit 185 adjusts the discharge temperature of the etching liquid by the temperature adjuster 46a individually such that the difference of the corresponding processing unit 16 in the etching average value and the etching uniformity from the reference values fall within a normal range. Furthermore, the abnormality handling unit 185 may determine new parameter values designating the heating temperature by the temperature adjuster 46a by performing an inverse operation, using the model expression 193, for example.

Further, the abnormality handling unit 185 may vary the discharge temperature of the etching liquid by changing parameter values designating the heating temperature of the etching liquid by the heater 82 of the chemical liquid supply unit 70. By way of example, assume that it is determined that a certain wafer W has the abnormality in the etching average value or the etching uniformity. In this case, the abnormality handling unit 185 may control the chemical liquid supply unit 70 to change the discharge temperature of the etching liquid onto a wafer W to be subjected to subsequent liquid processings.

Furthermore, the abnormality handling unit 185 may vary the in-surface temperature distribution of the wafer W in the liquid processing by changing the processing conditions such that the temperature control liquid is supplied from the rear surface supply 60. This may be accomplished by changing, for example, a parameter value defining a heating temperature of the temperature control liquid by the temperature adjuster 61d, a parameter value defining an opening/closing of the valve 61c, a parameter value defining a heating temperature of the temperature control liquid by the temperature control liquid source 61b, and so forth.

Moreover, the abnormality handling unit 185 may vary the in-surface temperature distribution of the wafer W in the liquid processing by changing the temperature within the chamber 20. This may be accomplished by changing a parameter value defining a heating temperature by the temperature adjuster 21d, for example.

Besides, when the abnormality of, for example, the etching average value is found, the abnormality handling unit 185 may change a parameter value defining a discharging time of the etching liquid such that the etching average value falls within a normal range.

In addition, in the determination processing by the determination unit 184, if it is determined that the condensation may have occurred in the drying processing, the abnormality handling unit 185 may change a dew point temperature by controlling the temperature adjuster 21d to change the internal temperature of the chamber 20. Further, the abnormality handling unit 185 may change the dew point temperature by controlling the humidity adjuster 21e to change the humidity within the chamber 20. Moreover, the abnormality handling unit 185 may change the temperature of the wafer W in the replacement processing by controlling at least one of the temperature adjuster 46c, the replacement liquid supply unit 90 and the rear surface supply 60.

Besides, the abnormality handling unit 185 may perform, as the abnormality handling processing, a processing of outputting abnormality information to an external device 5 connected to the control device 4 through a network such as Internet. In the abnormality information, information indicating the content of abnormality is matched with the wafer ID or the like.

<Sequence of Monitoring Processing>

Now, a sequence of the monitoring processing performed by the controller 18 will be explained with reference to FIG. 13. FIG. 13 is a flowchart showing the sequence of the monitoring processing according to the exemplary embodiment.

As illustrated in FIG. 13, the collecting unit 182 of the controller 18 collects multiple parameter values defining processing conditions for the liquid processing and sensor values of various sensors including the first temperature sensor 110 and the second temperature sensor 120 (process S101). Then, the monitoring unit 183 of the controller 18 generates the temperature distribution information 194 by using the collection information 192 and the model expression 193 (process S102).

Then, the determination unit 184 of the controller 18 determines, based on the generated temperature distribution information 194, whether the result of the liquid processing is normal (process S103). A specific example of this determination will be described later.

If it is determined in the process S103 that the result of the liquid processing is not normal, that is, the result of the liquid processing is abnormal (process S103, No), the abnormality handling unit 185 of the controller 18 performs the abnormality handling processing (process S104). If the processing of the process S104 is completed or if it is determined in the process S103 that the result of the liquid processing is normal (process S103, Yes), the controller 18 ends the monitoring processing.

First Example of Determination Processing:
Comparison of Temperature Distribution
Information with Threshold Value FIG. 14 is a flowchart illustrating a first example of the determination processing of the process S103 shown in FIG. 13.

Figure 14:
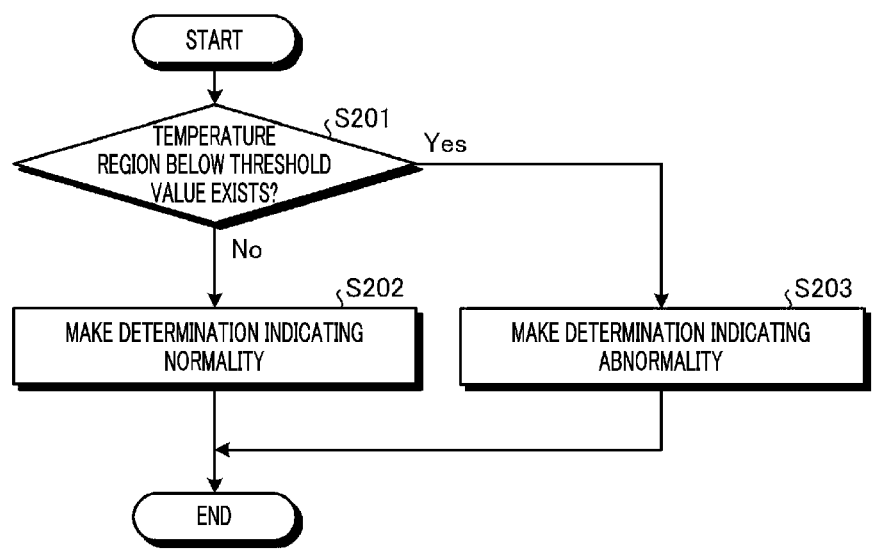
FIG. 14 is a flowchart illustrating a first example of a determining processing of a process S103 shown in FIG. 13.

As depicted in FIG. 14, by comparing the temperature distribution information 194 with a previously set threshold value, the determination unit 184 of the controller 18 determines whether a temperature region below the threshold value exists (process S201). If there is no temperature region below the threshold value (process S201, No), the determination unit 184 makes a determination that the processing result of the liquid processing (for example, the etching processing) is normal (process S202). Meanwhile, if there exists the temperature region below the threshold value (process S201, Yes), the determination unit 184 makes a determination that the processing result of the liquid processing is abnormal (process S203).

By way of example, if the previously set threshold value is 50° C., it is determined based on the temperature distribution information 194 whether there exists a region below 50° C. within the surface of the wafer W. If the region below 50° C. exists, the determination unit 184 makes a determination that the processing result of the liquid processing (for example, the etching processing) is abnormal.

In this example, the determination processing is performed by using the lower-limit threshold value. However, the determination unit 184 may carry out the determination processing by using an upper-limit threshold value. Further, the determination unit 184 may perform the determination processing by using a threshold range having upper and lower limits.

Second Example of Determination Processing:
Comparison of Etching Rate Distribution Information with Threshold Value FIG. 15 is a flowchart illustrating a second example of the determination processing of the process S103 shown in FIG. 13.

Figure 15:
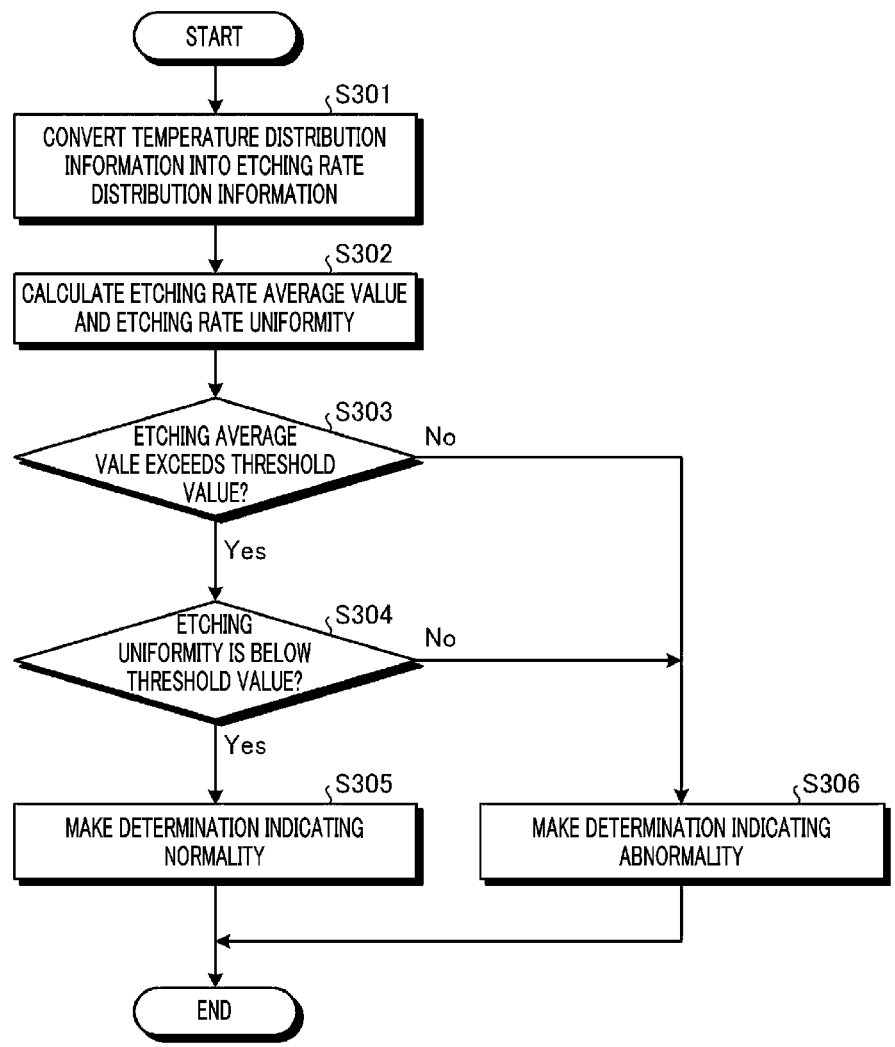
FIG. 15 is a flowchart illustrating a second example of the determining processing of the process S103 in FIG. 13.

As depicted in FIG. 15, the determination unit 184 converts the temperature distribution information 194 to the etching rate distribution information (process S301), and calculates an etching rate average value and an etching rate uniformity based on the etching rate distribution information (process S302).

Then, the determination unit 184 determines whether the etching average value exceeds a threshold value (process S303), and if not (process S303, No), the determination unit 184 makes a determination that the result of the etching processing is abnormal (process S306).

Meanwhile, if the etching average value is found in the process S303 to exceed the threshold value (process S303, Yes), the determination unit 184 determines whether the etching uniformity falls below a threshold value (process S304). In this processing, if the etching uniformity is not below the threshold value (process S304, No), the determination unit 184 makes a determination that the result of the etching processing is abnormal (process S306). Meanwhile, if the etching uniformity is below the threshold value (process S303, Yes), the determination unit 184 makes a determination that the result of the etching processing is normal (process S305).

Third Example of Determination Processing:
Regarding Whether Result of Drying Processing is Good or Bad FIG. 16 is a flowchart illustrating a third example of the determination processing of the process S103 shown in FIG. 13.

Figure 16:
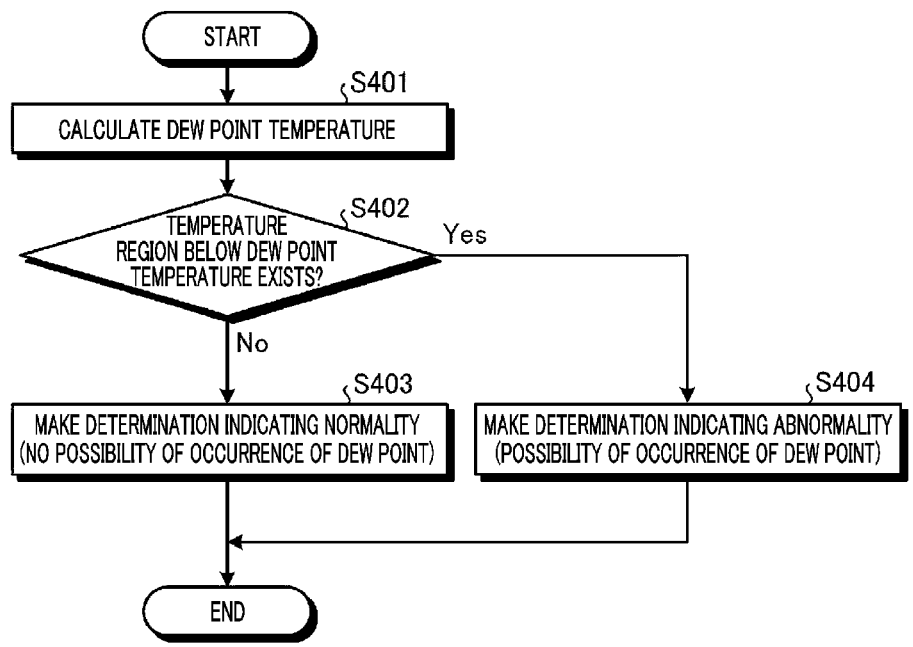
FIG. 16 is a flowchart illustrating a third example of the determining processing of the process S103 in FIG. 13.

As depicted in FIG. 16, the determination unit 184 first calculates a dew point temperature (process S401). For example, the determination unit 184 calculates the dew point temperature within the chamber 20 in the liquid processing by using the space temperature and the space humidity included in the collection information 192.

Then, by comparing the temperature distribution information 194 and the dew point temperature, the determination unit 184 determines whether a temperature region below the dew point temperature exists (process S402). If there exists no temperature region below the dew point temperature (process S401, No), the determination unit 184 makes a determination that the result of the drying processing is normal, that is, there is no possibility of the occurrence of the condensation on the wafer W during the drying processing (process S403). Meanwhile, if there is the temperature region below the dew point temperature (process S402, Yes), the determination unit 184 makes a determination that the result of the drying processing is abnormal, that is, the condensation may have occurred on the wafer W during the drying processing (process S404).

Further, the determination unit 184 may not necessarily perform the processing of the process S401. For example, the determination unit 184 may make the determination of the process S402 by using a previously set dew point temperature. Further, the temperature and the humidity used in the calculation of the dew point temperature need not necessarily be the temperature and the humidity within the chamber 20, and they may be, for example, a temperature and a humidity within a factory in which the substrate processing system 1 is installed.

As stated above, the substrate processing method according to the exemplary embodiment includes a process of performing a liquid processing, a detecting process, a generating process, and a determining process. In the process of performing the liquid processing, the liquid processing is performed on a substrate (for example, a wafer W), using a processing unit (for example, the processing unit 16) equipped with a substrate holding mechanism (for example, the substrate holding mechanism 30) configured to hold the substrate horizontally and a processing liquid supply (for example, the processing liquid supply 40) configured to supply a processing liquid (for example, the etching liquid, the rinse liquid, or the replacement liquid) onto the substrate held by the substrate holding mechanism. In the detecting process, a temperature of a central portion of the substrate and a temperature of an edge portion of the substrate in the liquid processing are respectively detected by using a plurality of sensors (for example, the first temperature sensor 110, the second temperature sensor 120, etc.) provided in the processing unit. In the generating process, temperature distribution information (for example, the temperature distribution information 194) indicating an in-surface temperature distribution of the substrate in the liquid processing is generated based on one or more parameter values defining a processing condition for the liquid processing and the temperatures of the central portion and the edge portion of the substrate detected in the detecting process. In the determining process, based on the temperature distribution information, it is determined whether a result of the liquid processing is good or bad.

Thus, according to the substrate processing method of the exemplary embodiment, it is possible to investigate appropriately, for each product wafer, whether a result of a liquid processing upon the product substrate is good or bad.

The processing liquid supply includes a nozzle (for example, the nozzle 41) configured to discharge the processing liquid; and a supply line (for example, the supply lines 44a to 44c) connected to the nozzle to supply the processing liquid to the nozzle. Further, in the process of performing the liquid processing, the processing liquid is discharged toward the central portion of the substrate from the nozzle. Further, in the detecting process, a temperature detected by a temperature sensor (for example, the first temperature sensor 110) provided in the nozzle or the supply line is detected as a temperature of the central portion of the substrate. Accordingly, the temperature of the central portion of the substrate can be easily investigated.

The substrate holding mechanism includes a plurality of grippers (for example, the grippers 31a) each configured to hold an edge portion of the substrate. Further, in the detecting process, a temperature detected by a temperature sensor (for example, the second temperature sensor 120) provided in at least one of the plurality of grippers is detected as a temperature of the edge portion of the substrate. Accordingly, the temperature of the edge portion of the substrate can be easily investigated.

The one or more parameter values include at least one of a space temperature within the processing unit, a space humidity within the processing unit, a discharge flow rate of the processing liquid, or a rotation number of the substrate. Accordingly, accuracy of the temperature distribution information can be improved.

In the determining process, presence or absence of a difference in a result of the liquid processing between a plurality of substrates (for example, a difference between wafers W) is detected for each substrate based on multiple temperature distribution information generated by the generating process. Accordingly, presence or absence of the difference between the wafers can be monitored easily.

In the process of performing the liquid processing, the liquid processing upon the plurality of substrates is performed by using a plurality of processing units. Further, in the determining process, presence or absence of a difference in the result of the liquid processing between the plurality of processing units (for example, a difference between the processing units 16) is determined for each processing unit based on the multiple temperature distribution information generated by the generating process. Accordingly, presence or absence of the difference between the processing units can be monitored easily.

In the determining process, presence or absence of a difference in the result of the liquid processing between a plurality of lots (for example, a different between the lots) is determined for each lot as a manufacturing unit of substrates based on the multiple temperature distribution information generated by the generating process. Accordingly, presence or absence of the difference between the lots can be easily monitored.

The substrate processing method according to the exemplary embodiment includes a process of acquiring a dew point temperature within the processing unit. Further, in the determining process, presence or absence of condensation on the substrate in the liquid processing (for example, the drying processing) is detected based on the temperature distribution information and the dew point temperature. Accordingly, it is possible to easily specify a substrate on which a watermark is likely to be formed.

The substrate processing method according to the exemplary embodiment includes a process of correcting a temperature of the processing liquid discharged from the processing liquid supply by controlling a temperature adjuster (for example, the temperature adjusters 46a and 46c) provided in the supply line based on the temperature distribution information. Accordingly, it is possible to reduce the number of substrates determined to be abnormal in the result of the liquid processing.

The substrate processing method according to the exemplary embodiment includes a process of correcting at least one of the one or more parameter values based on the temperature distribution information. Accordingly, it is possible to reduce the number of substrates determined to be abnormal in the result of the liquid processing.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to appropriately investigate, for every product substrate, whether the result of the liquid processing upon the product substrate is good or bad.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing method, comprising:
    performing a liquid processing on a substrate by using a processing unit including a substrate holding mechanism configured to hold the substrate horizontally and a processing liquid supply configured to discharge a processing liquid toward the substrate held by a gripper of the substrate holding mechanism;
    detecting a temperature of a central portion of the substrate and a temperature of an edge portion of the substrate in the liquid processing by using multiple sensors provided in the processing unit;
    generating temperature distribution information indicating an in-surface temperature distribution of the substrate in the liquid processing based on one or more parameter values defining a processing condition for the liquid processing and the temperature of the central portion of the substrate and the temperature of the edge portion of the substrate detected in the detecting of the temperature; and
    determining, based on the temperature distribution information, whether a result of the liquid processing is good or bad,
    wherein, in the detecting of the temperature, a temperature detected by at least one of the multiple sensors provided at the griper of the substrate holding mechanism is detected as the temperature of the edge portion of the substrate.

2. The substrate processing method of claim 1,
    wherein the processing liquid supply includes a nozzle configured to discharge the processing liquid and a supply line connected to the nozzle to supply the processing liquid to the nozzle,
    in the performing of the liquid processing, the processing liquid is discharged toward the central portion of the substrate from the nozzle, and in the detecting of the temperature, a temperature detected by a temperature sensor provided in the nozzle or provided in the supply line is detected as the temperature of the central portion of the substrate.

3. The substrate processing method of claim 2, wherein the substrate holding mechanism includes multiple grippers each configured to hold the edge portion of the substrate, and in the detecting of the temperature, a temperature detected by a temperature sensor provided in at least one of the multiple grippers is detected as the temperature of the edge portion of the substrate.

4. The substrate processing method of claim 2, wherein the one or more parameter values include at least one of a space temperature within the processing unit, a space humidity within the processing unit, a discharge flow rate of the processing liquid, or a rotation number of the substrate.

5. The substrate processing method of claim 2, wherein the substrate includes multiple substrates, and in the determining of whether the result of the liquid processing is good or bad, presence or absence of a difference in a result of the liquid processing between the multiple substrates is determined for each substrate based on the temperature distribution information generated in the generating of the temperature distribution information.

6. The substrate processing method of claim 2, wherein the processing unit includes multiple processing units, and the substrate includes multiple substrates, in the performing of the liquid processing, the liquid processing upon the multiple substrates is performed by using the multiple processing units, and in the determining of whether the result of the liquid processing is good or bad, presence or absence of a difference in a result of the liquid processing between the multiple processing units is determined for each processing unit based on the temperature distribution information generated in the generating of the temperature distribution information.

7. The substrate processing method of claim 2, wherein, in the determining of whether the result of the liquid processing is good or bad, presence or absence of a difference in a result of the liquid processing between lots is determined for each lot based on the temperature distribution information generated in the generating of the temperature distribution information, the lot being a manufacturing unit of the substrate.

8. The substrate processing method of claim 2, further comprising:

acquiring a dew point temperature within the processing unit, wherein, in the determining of whether the result of the liquid processing is good or bad, presence or absence of condensation on the substrate in the liquid processing is determined based on the temperature distribution information and the dew point temperature.

9. The substrate processing method of claim 2, further comprising:

correcting a temperature of the processing liquid discharged from the processing liquid supply by controlling a temperature adjuster provided in the supply line based on the temperature distribution information.

10. The substrate processing method of claim 1, wherein the substrate holding mechanism includes multiple grippers each configured to hold the edge portion of the substrate, and in the detecting of the temperature, a temperature detected by a temperature sensor provided in at least one of the multiple grippers is detected as the temperature of the edge portion of the substrate.

11. The substrate processing method of claim 1, wherein the one or more parameter values include at least one of a space temperature within the processing unit, a space humidity within the processing unit, a discharge flow rate of the processing liquid, or a rotation number of the substrate.

12. The substrate processing method of claim 1, wherein the substrate includes multiple substrates, and in the determining of whether the result of the liquid processing is good or bad, presence or absence of a difference in a result of the liquid processing between the multiple substrates is determined for each substrate based on the temperature distribution information generated in the generating of the temperature distribution information.

13. The substrate processing method of claim 1, wherein the processing unit includes multiple processing units, and the substrate includes multiple substrates, in the performing of the liquid processing, the liquid processing upon the multiple substrates is performed by using the multiple processing units, and in the determining of whether the result of the liquid processing is good or bad, presence or absence of a difference in a result of the liquid processing between the multiple processing units is determined for each processing unit based on the temperature distribution information generated in the generating of the temperature distribution information.

14. The substrate processing method of claim 1, wherein, in the determining of whether the result of the liquid processing is good or bad, presence or absence of a difference in a result of the liquid processing between lots is determined for each lot based on the temperature distribution information generated in the generating of the temperature distribution information, the lot being a manufacturing unit of the substrate.

15. The substrate processing method of claim 2, further comprising:

acquiring a dew point temperature within the processing unit, wherein, in the determining of whether the result of the liquid processing is good or bad, presence or absence of condensation on the substrate in the liquid processing is determined based on the temperature distribution information and the dew point temperature.

16. The substrate processing method of claim 1, further comprising:

correcting at least one of the one or more parameter values based on the temperature distribution information.

17. A substrate processing apparatus, comprising:

a substrate holding mechanism including a gripper configured to hold a substrate horizontally;

a processing liquid supply configured to discharge a processing liquid toward the substrate held by the substrate holding mechanism;

a first temperature sensor configured to detect a temperature of a central portion of the substrate held by the substrate holding mechanism;

a second temperature sensor configured to detect a temperature of an edge portion of the substrate held by the substrate holding mechanism; and a controller, wherein the controller controls the substrate holding mechanism, the processing liquid supply, the first temperature sensor, and the second temperature sensor to perform a substrate processing method comprising:

performing a liquid processing on the substrate by discharging the processing liquid onto the substrate from the processing liquid supply in a state that the substrate is held by the gripper of the substrate holding mechanism horizontally;

detecting the temperature of the central portion of the substrate and the temperature of the edge portion of the substrate in the liquid processing by using the first temperature sensor and the second temperature sensor, respectively;

generating temperature distribution information indicating an in-surface temperature distribution of the substrate in the liquid processing based on one or more parameter values defining a processing condition for the liquid processing and the temperature of the central portion of the substrate and the temperature of the edge portion of the substrate detected in the detecting of the temperature; and determining, based on the temperature distribution information, whether a result of the liquid processing is good or bad, wherein, in the detecting of the temperature, a temperature detected by at least one of the multiple sensors provided at the griper of the substrate holding mechanism is detected as the temperature of the edge portion of the substrate.

* * * * *